US012628693B2

(12) United States Patent
Park et al.

(10) Patent No.: US 12,628,693 B2
(45) Date of Patent: May 12, 2026

(54) SEMICONDUCTOR PACKAGE AND METHOD OF MANUFACTURING SEMICONDUCTOR PACKAGE

(71) Applicant: LIPAC CO., LTD., Seoul (KR)

(72) Inventors: Dong Woo Park, Seoul (KR); Seong Wook Choi, Seoul (KR)

(73) Assignee: LIPAC CO., LTD., Seoul (KR)

( * ) Notice: Subject to any disclaimer, the term of this patent is extended or adjusted under 35 U.S.C. 154(b) by 577 days.

(21) Appl. No.: 18/010,378

(22) PCT Filed: Jun. 15, 2021

(86) PCT No.: PCT/KR2021/007437

§ 371 (c)(1),
(2) Date: Dec. 14, 2022

(87) PCT Pub. No.: WO2021/256815

PCT Pub. Date: Dec. 23, 2021

(65) Prior Publication Data

US 2023/0268331 A1     Aug. 24, 2023

(30) Foreign Application Priority Data

Jun. 15, 2020     (KR) ........................ 10-2020-0072530

(51) Int. Cl.
| | |
|---|---|
| *H01L 27/15* | (2006.01) |
| *H01L 25/16* | (2023.01) |
| *H01L 29/16* | (2006.01) |
| *H01L 31/12* | (2006.01) |
| *H01L 33/00* | (2010.01) |

(52) U.S. Cl.
CPC .......... *H01L 25/167* (2013.01); *H01L 25/165* (2013.01)

(58) Field of Classification Search
CPC ................. H01L 25/167; H01L 25/165; H01L 25/041–043; H10F 77/50
See application file for complete search history.

(56) References Cited

U.S. PATENT DOCUMENTS

| | | | |
|---|---|---|---|
| 2014/0164713 A1* | 6/2014 | Sim ..................... | G06F 12/0888 |
| | | | 711/138 |
| 2015/0262983 A1 | 9/2015 | Krabe et al. | |

(Continued)

FOREIGN PATENT DOCUMENTS

| | | |
|---|---|---|
| CN | 106233460 A | 12/2016 |
| CN | 110911427 A | 3/2020 |

(Continued)

OTHER PUBLICATIONS

International Search Report for PCT/KR2021/007437 mailed Oct. 13, 2021 from Korean Intellectual Property Office.

(Continued)

*Primary Examiner* — Ismail A Muse
(74) *Attorney, Agent, or Firm* — Paratus Law Group, PLLC

(57) ABSTRACT

A method for forming a package includes: molding a semiconductor chip and a light-emitting element; forming a redistribution layer (RDL) which electrically connects the semiconductor chip to the light-emitting element; and arranging a light-receiving element on the redistribution layer to be electrically connected thereto. The light-receiving element is arranged such that at least a portion thereof is located directly above the semiconductor chip.

23 Claims, 15 Drawing Sheets

(56)                   References Cited

U.S. PATENT DOCUMENTS

| | | | |
|---|---|---|---|
| 2016/0029911 A1* | 2/2016 | Lee .................... | A61B 5/02427 |
| | | | 600/407 |
| 2018/0082990 A1 | 3/2018 | Furuyama | |
| 2018/0303359 A1* | 10/2018 | O'Brien ................ | H10F 77/413 |
| 2019/0250257 A1 | 8/2019 | Finkelstein et al. | |
| 2020/0185581 A1* | 6/2020 | Liu ........................ | H10H 20/01 |
| 2021/0005761 A1* | 1/2021 | Tsai ...................... | H01L 25/165 |
| 2021/0134728 A1* | 5/2021 | Rubin ................ | H01L 21/4853 |

FOREIGN PATENT DOCUMENTS

| | | |
|---|---|---|
| KR | 10-2006-0110354 A | 10/2006 |
| KR | 10-2016-0132962 A | 11/2016 |
| KR | 10-2018-0017481 A | 2/2018 |
| KR | 10-2019-0044487 A | 4/2019 |
| KR | 10-2019-0066587 A | 6/2019 |

OTHER PUBLICATIONS

Korean Office Action for related KR Application No. 10-2021-0077633 mailed Oct. 13, 2023 from Korean Intellectual Property Office.
Korean Office Action for related KR Application No. 10-2021-0077633 mailed Feb. 13, 2023 from Korean Intellectual Property Office.
Chinese Office Action for related CN Application No. 202180050150.1 mailed Apr. 21, 2025 from China National Intellectual Property Administration.

* cited by examiner (a)

SEMICONDUCTOR PACKAGE AND METHOD OF MANUFACTURING SEMICONDUCTOR PACKAGE

CROSS-REFERENCE TO PRIOR APPLICATIONS

This application is a National Stage Patent Application of PCT International Patent Application No. PCT/KR2021/007437 (filed on Jun. 15, 2021) under 35 U.S.C. § 371, which claims priority to Korean Patent Application No. 10-2020-0072530 (filed on Jun. 15, 2020), which are all hereby incorporated by reference in their entirety.

BACKGROUND

The present technology relates to a semiconductor package and a method of manufacturing the semiconductor package.

Technology of reconstructing a distance from a subject and a three-dimensional image of the subject by emitting a laser and using a time difference of light reflected from the subject is being applied in various fields such as mobile devices, automobiles, medical care, and the like. In order to implement this technology, a light-emitting element, a light-receiving element, and a chip which drives these elements and performs signal processing are required. In order to realize this in a mobile platform, lightening, thinning, and miniaturizing an optical element package are essentially required.

SUMMARY

Most currently used packages have large areas and complicated process operations. The embodiment is directed to solving the above-described difficulties of the related art. That is, providing a method capable of forming a semiconductor package including an optical element with a small area and a thin thickness is one of the problems to be solved by the present technology.

Further, optical members such as a lens, a diffuser, and the like are mainly used to manufacture a module, and additional component and assembly costs may be reduced, and the package itself may be manufactured with a smaller size by manufacturing the optical members directly on a semiconductor package at a wafer level.

A method of manufacturing a package according to the embodiment includes operations of: molding a semiconductor chip and a light-emitting element; forming a redistribution layer (RDL) configured to electrically connect the semiconductor chip and the light-emitting element; and arranging a light-receiving element on the redistribution layer to electrically connect the light-receiving element and the redistribution layer, wherein the light-receiving element is arranged so that at least a portion of the light-receiving element is located directly above the semiconductor chip.

A package according to the embodiment includes: a light-emitting element; a light-receiving element; a semiconductor chip on which a semiconductor circuit is formed; a mold configured to encapsulate the semiconductor chip and the light-emitting element; a redistribution layer configured to electrically connect the light-emitting element, the light-receiving element, and the semiconductor chip; a through via electrically connected to the redistribution layer and passing through the mold; and an external connection terminal electrically connected to the through via, wherein at least a portion of the light-receiving element is located directly above the semiconductor chip.

A package according to the embodiment includes: a light-emitting element; a semiconductor chip on which a semiconductor circuit is formed; a mold configured to encapsulate the semiconductor chip and the light-emitting element; a redistribution layer configured to electrically connect the light-emitting element and the semiconductor chip; a through via electrically connected to the redistribution layer and passing through the mold; and an external connection terminal electrically connected to the through via, wherein a conductive metal pattern is located on a bottom surface of the light-emitting element.

According to the embodiment, there is an advantage that an optical element package occupying a small area through a simple process is provided.

BRIEF DESCRIPTION OF THE DRAWINGS

FIG. 3, (c) is a view schematically illustrating a state in which a conductive adhesive layer is formed on a second electrode and a metal pattern thicker than the second electrode is bonded.

FIG. 4 is a view schematically illustrating an operation of forming a redistribution layer which electrically connects the semiconductor chip and the light-emitting element.

FIG. 6 is a view illustrating an outline of a state in which a light-receiving element is arranged on a redistribution layer to be electrically connected to the redistribution layer according to another embodiment.

FIG. 8 is a view illustrating a state in which an external connection terminal is exposed.

FIGS. 12 and 13 are views illustrating a member holder of the package.

DETAILED DESCRIPTION

Figure 1:
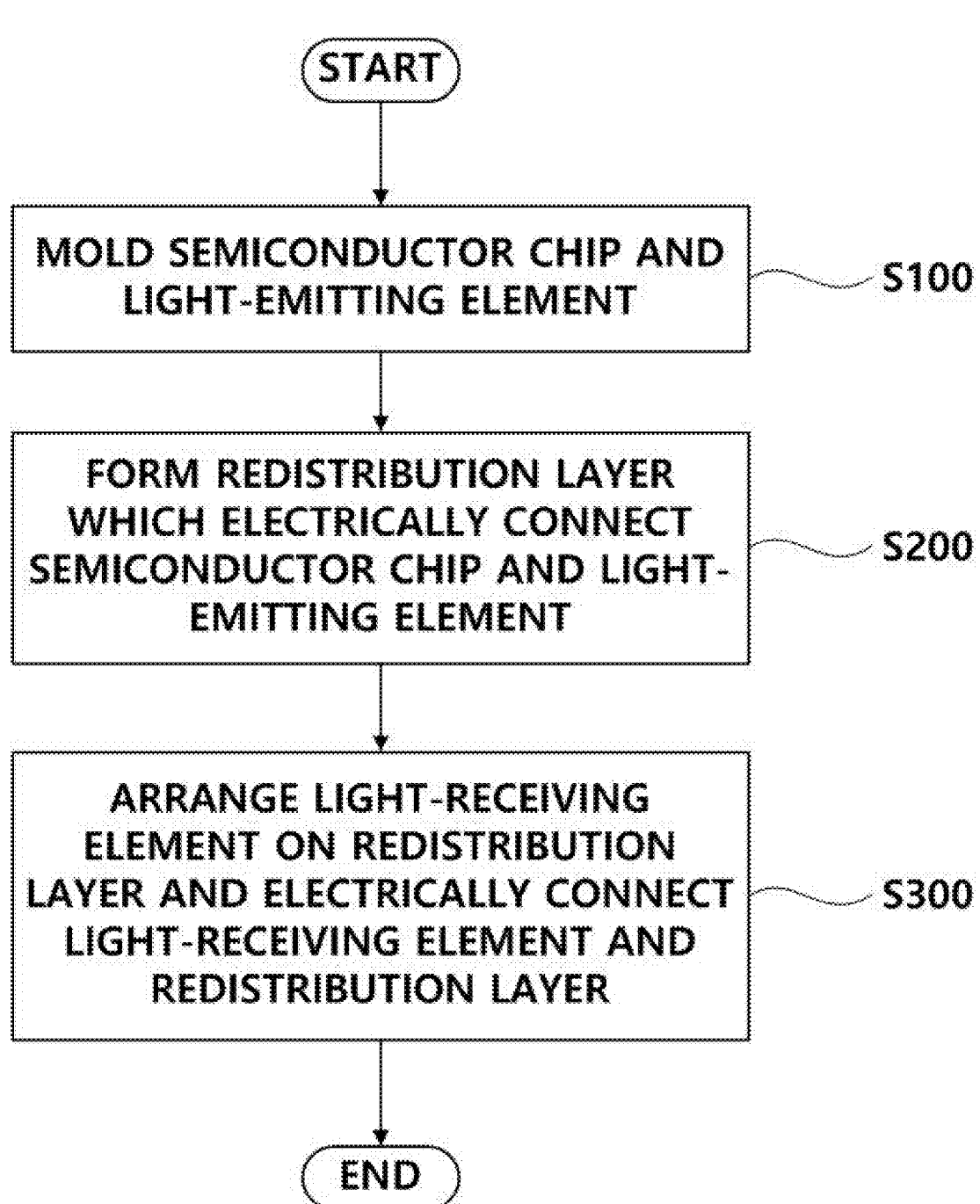
FIG. 1 is a flow chart illustrating an outline of a method of manufacturing a semiconductor package according to the embodiment.

Hereinafter, the embodiment will be described with reference to the accompanying drawings. FIG. 1 is a flow chart illustrating an outline of a method of manufacturing a semiconductor package according to the embodiment. Referring to FIG. 1, the method of manufacturing a semiconductor package includes molding a semiconductor chip and a light-emitting element, forming a redistribution layer (RDL) configured to electrically connect the semiconductor chip and the light-emitting element, and arranging a light-receiving element on the redistribution layer to electrically connect the light-receiving element and the redistribution layer, wherein the light-receiving element is arranged so that at least a portion of the light-receiving element is located directly above the semiconductor chip.

Figure 2:
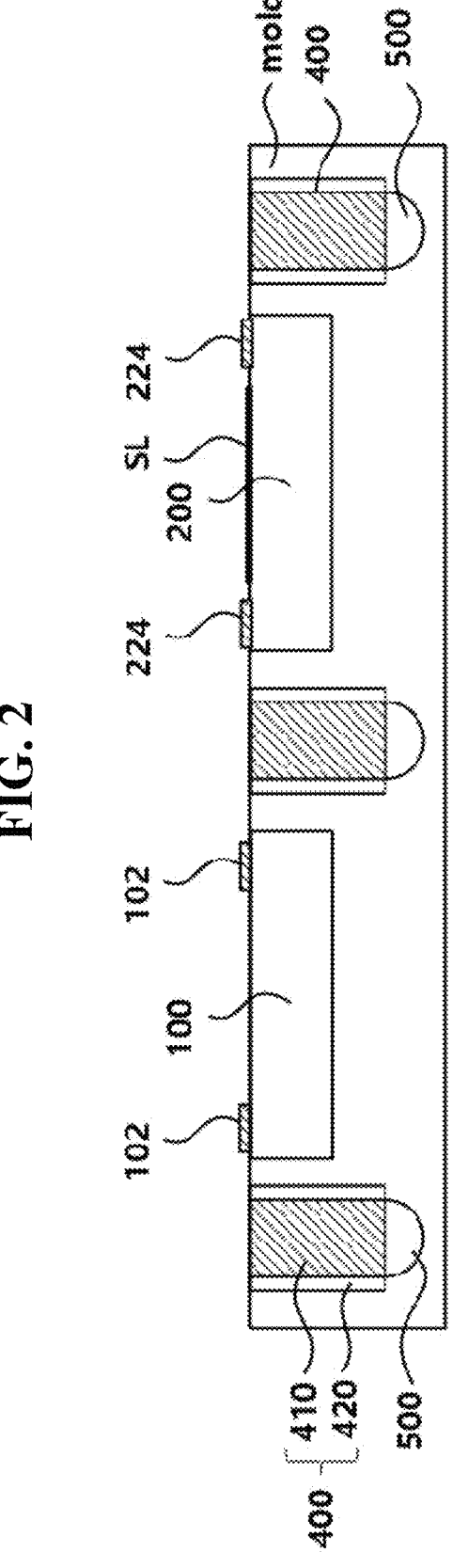
FIG. 2 is a view illustrating a result of performing an operation of molding a light-emitting element and a semiconductor chip.

FIGS. 2 to 12 are cross-sectional views of a schematic process illustrating each operation of the method of manufacturing a semiconductor package according to the embodiment. FIG. 2 is a view illustrating a result of performing an operation of molding a light-emitting element 200 and a semiconductor chip 100 (S100). Referring to FIG. 2, pads 102 which transmit electrical signals to a circuit formed in the semiconductor chip 100 and provide electrical signals formed in the circuit to the outside may be located on one surface of the semiconductor chip 100. Further, electrodes 224 may be located on one surface of the light-emitting element 200.

Figure 3:
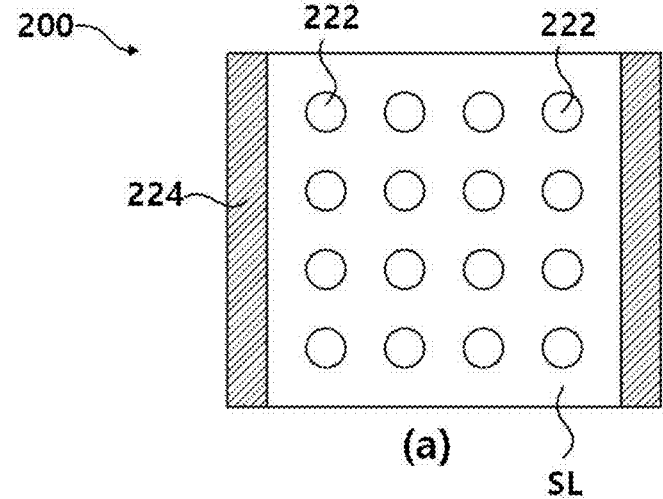
FIG. 3, (a) is a view illustrating a light-emitting surface of the light-emitting element, and FIG. 3, (b) is a view schematically illustrating a cross-section of the light-emitting element.
Figure 3:
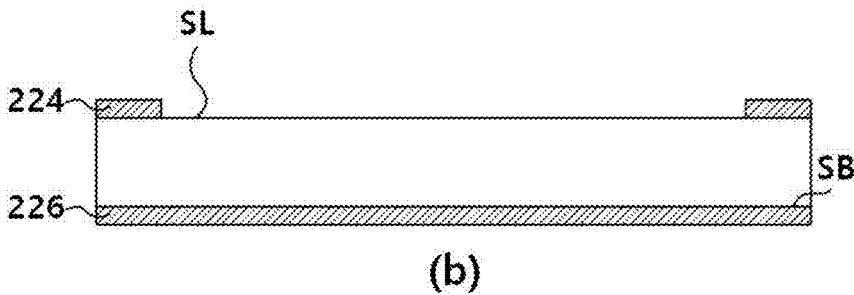
Figure 3:
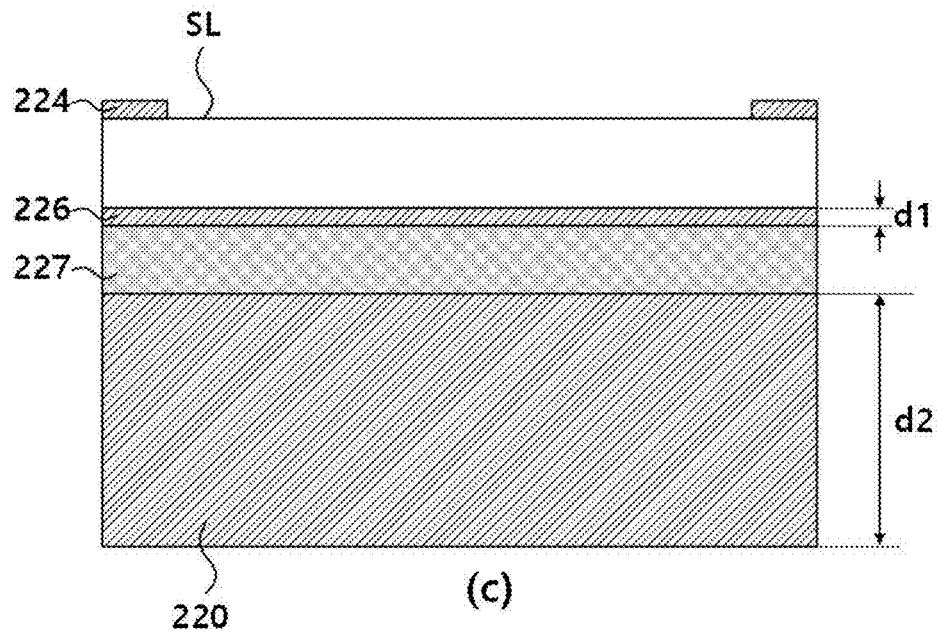

FIG. 3, (a) is a view illustrating a light-emitting surface SL of the light-emitting element 200, and FIG. 3, (b) is a view schematically illustrating a cross-section of the light-emitting element 200. The light-emitting element 200 according to the embodiment may be a light-emitting element such as a vertical cavity surface emitting laser (VCSEL), a light-emitting diode (LED), or the like, and may provide light in a wavelength range such as infrared light, visible light, ultraviolet light, or the like.

Referring to FIG. 3, (a), the light-emitting element 200 includes the light-emitting surface SL and a back surface SB. A plurality of light sources 222 may be located on the light-emitting surface SL, and a first electrode 224 providing driving power so that the light-emitting element 200 emits light is located on the light-emitting surface SL. A second electrode 226 is located on the back surface SB that is opposite to the light-emitting surface SL.

For example, the first electrode 224 may be connected to an anode electrode of the light source 222, and the second electrode 226 may be connected to a cathode electrode of the light source 222. As another example, the first electrode 224 may be connected to a cathode electrode of the light source 222, and the second electrode 226 may be connected to an anode electrode of the light source 222. As still another example, since the first electrode is configured as two electrodes, and thus includes both an anode electrode and a cathode electrode on the light-emitting surface SL, an element not having an electrode may be used on the back surface SB.

As shown in FIG. 3, (a) and (b), since thicknesses of the light-emitting element 200 and the second electrode 226 are thin, handling may be difficult. Furthermore, even in connection to a mother substrate 1000 (see FIG. 13) for providing the driving power to the second electrode 226, there may be a case in which a restriction occurs due to the thicknesses of the second electrode 226 and the light-emitting element 200.

However, in the embodiment, as illustrated in FIG. 3, (c), a conductive adhesive layer 227 is formed on the second electrode 226, and a metal pattern 220 thicker than the second electrode 226 is bonded. Accordingly, it is possible to overcome a restriction due to the thicknesses of the light-emitting element 200 and the second electrode 226.

In the shown embodiment, the conductive adhesive layer 227 may include silver epoxy, and the conductive metal pattern 220 is a conductive metal pattern such as a copper pattern, an aluminum pattern, a gold pattern, or the like, and may be formed of a metal material having good conductivity. Further, a thickness d2 of the metal pattern 220 may be at least two times greater than a thickness d1 of the second electrode 226, and preferably, three times or more.

In another embodiment (not shown), the conductive metal pattern may include a non-metal material in which a conductive via is formed. As another embodiment (not shown), the conductive adhesive layer 227 may be formed of a material such as gold-tin (AuSn) or the like, and may bond the second electrode 226 and the metal pattern 220 using eutectic bonding.

As still another embodiment, the conductive metal pattern 220 may be formed by forming nanoparticles formed of a conductive metal such as copper, gold, nickel, or the like on the second electrode 226 and sintering the nanoparticles. The conductive metal nanoparticles may be dispersed in a solvent and then may be formed in a form of being sprayed, applied, or the like to the second electrode 226.

In the embodiment shown in FIG. 3, (a) to (c), although the light-emitting element is illustrated, a conductive metal pattern 120 may be attached to the semiconductor chip 100 in a similar manner. The conductive metal pattern 120 attached to the semiconductor chip 100 and the conductive metal pattern 220 attached to the light-emitting element 200 may not only provide the driving power to the light-emitting element 200 and the semiconductor chip 100, but also function as a heat sink.

Referring to FIG. 2 again, an external connection terminal 500 is formed on an end of a through via 400. The through via 400 may include a conductive rod 410 formed of a conductive material and a shell 420 which encapsulates the conductive rod.

The external connection terminal 500 may be formed at an end of the conductive rod 410. For example, as illustrated in the drawing, the external connection terminal 500 may be a solder ball. The solder ball may be formed by performing reflow after forming a seed layer (not shown) for plating on the end of the conductive rod 410, and then performing plating to form a solder material such as tin, silver, or the like. In another example (not shown), the external connection terminal may be a pad which may be connected to the solder ball or the like formed on the mother substrate. In still another example, the external connection terminal may be a conductive bump.

The conductive rod 410 on which the external connection terminal 500 is formed and the shell 420 may be molded together in an encapsulant, and the external connection terminal 500 may be exposed through a later process to form the through via 400 (see FIG. 8). The external connection terminal 500 may be bonded to a connection terminal located on the mother substrate 1000 (see FIG. 13) to electrically connect the package and the mother substrate 1000 (see FIG. 13).

The semiconductor chip 100 and the light-emitting element 200 are molded using an encapsulant (S100). In the molding process, a plurality of semiconductor chips and a plurality of light-emitting elements may be molded. The semiconductor chip may be a chip which drives a light-receiving element and takes charge of signal processing, or drives a memory, an arithmetic element, and a light-emitting element. Alternatively, the semiconductor chip may include an element capable of measuring a temperature in the package. In addition, the semiconductor mold may further include a light-receiving element. In this case, the light-receiving element may be used as a monitor used to detect damage to optical members such as a lens, a diffuser, and the like fixed thereon through a holder (900, see FIG. 12 or 13). As another example, the light-receiving element may be an auxiliary sensor used to perform time of flight (TOF) sensing.

The encapsulant may be an epoxy mold compound (EMC), and is separated from a carrier substrate (not shown) after the encapsulant (mold) is cured. As shown in the drawings, the external connection terminal 500 formed on the end of the through via 400 may be buried in the cured encapsulant (mold), but is exposed to the outside in a later process (see FIG. 8).

The shown embodiment illustrates forming the through via 400 using the conductive rod 410 on which the external connection terminal 500 is formed, but according to the embodiment (not shown), the through via may be formed by molding a sacrificial member (not shown) having a lower hardness than the mold together, and then forming a through hole passing through the sacrificial member, and forming a conductive material in the through hole.

For example, the operation of forming the through hole may be performed by a method such as drilling, etching, or the like. The operation of forming the conductive material may be performed by forming the conductive material in the through hole at least to the extent that a conductive path is formed through the mold.

Figure 4:
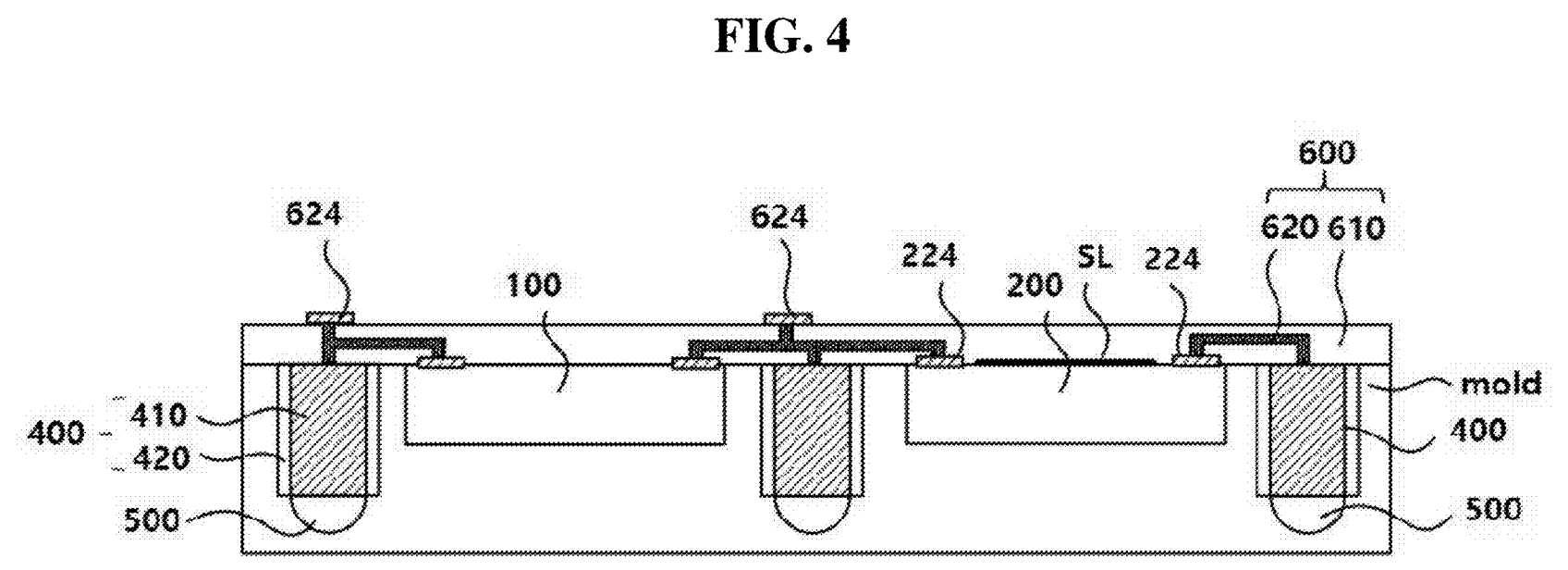

FIG. 4 is a view schematically illustrating an operation of forming a redistribution layer (RDL) 600 which electrically connects the semiconductor chip 100 and the light-emitting element 200. The redistribution layer 600 includes a wire pattern 620 which electrically connects elements such as an insulating layer 610 and the semiconductor chip 100, the light-emitting element 200, and the light-receiving element 300 (see FIG. 5) arranged in a subsequent process.

The insulating layer 610 may be formed of one of a polymer such as polyimide or the like and an oxide film, and may passivate the semiconductor chip 100 and the light-emitting element 200 to prevent penetration of foreign substances in an external environment into the inside.

The redistribution layer 600 may be formed on the light-emitting surface SL of the light-emitting element 200. The wire pattern 620 is arranged to avoid the light-emitting surface SL of the light-emitting element 200 so that light provided by the light-emitting element 200 is not blocked, scattered, diffracted, or refracted by the redistribution layer 600. Further, the insulating layer 610 includes a material capable of transmitting light in a wavelength band emitted by the light-emitting element 100. For example, the insulating layer 610 may be formed of one of a polymer such as polyimide or the like and an oxide film having a transmittance of 90% or more when the light-emitting element 100 provides light in a 940 nm wavelength band. The wire pattern 620 may be formed of a material having high conductivity, such as copper, aluminum, gold, or the like.

Pads 624 which may be electrically connected to elements to be located thereon in a subsequent process may be formed on the redistribution layer 600. The pads 624 may be formed by being open to form pads connected to the wire pattern at desired positions and performing plating. Since the pads 624 may be formed of, for example, copper, and may be easily oxidized in air, coating may be performed to improve a bonding strength with the pads 624.

For example, the pad 624 may be coated with electroless nickel electroless palladium immersion gold (ENEPIG) in which electroless nickel, electroless palladium, and a gold layer are stacked on a copper pattern. As another example, the pad 624 may be coated with electroless nickel immersion gold (ENIG) in which electroless nickel and a gold layer are stacked on a copper pattern. As still another example, in the pad 624, tin (Sn) may be coated on the copper pad using hot air leveling (HAL). As yet another example, the copper pad 624 may be coated with an organic material selectively bonded to copper through organic solderability preservative (OSP).

Figure 5:
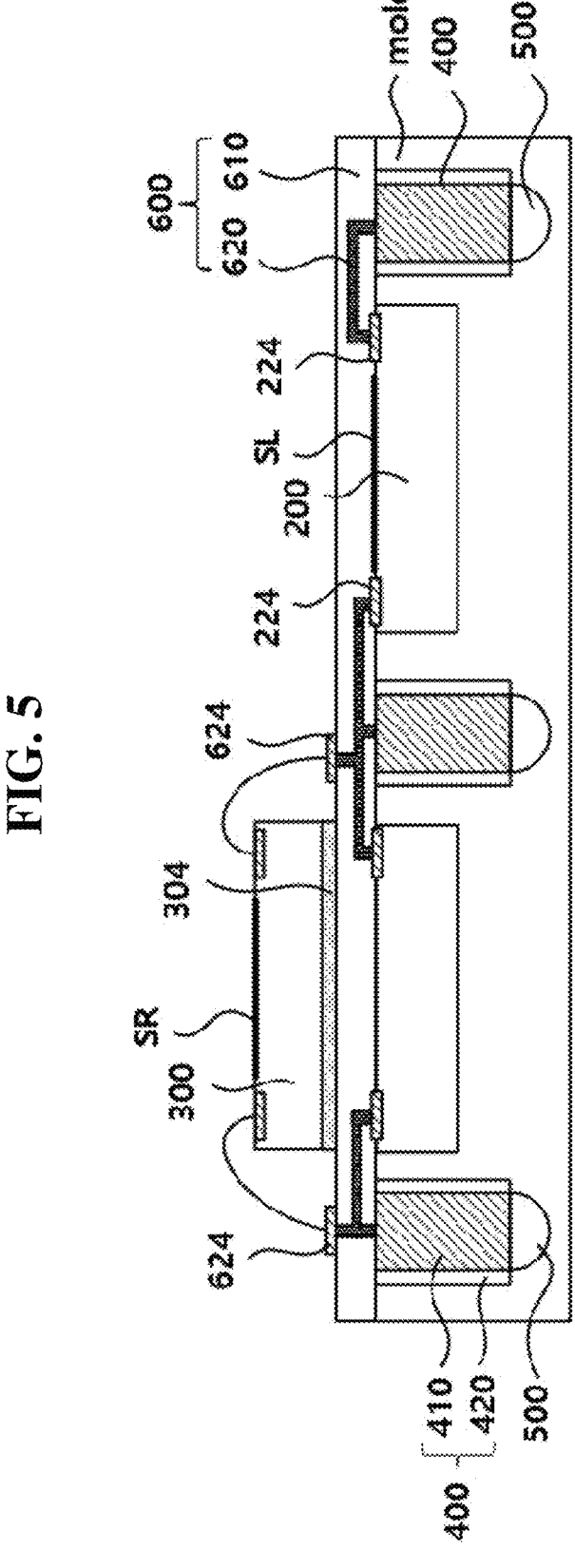
FIG. 5 is a cross-sectional view illustrating a state in which a light-receiving element 300 is arranged on the redistribution layer to be electrically connected to the redistribution layer.
Figure 6:
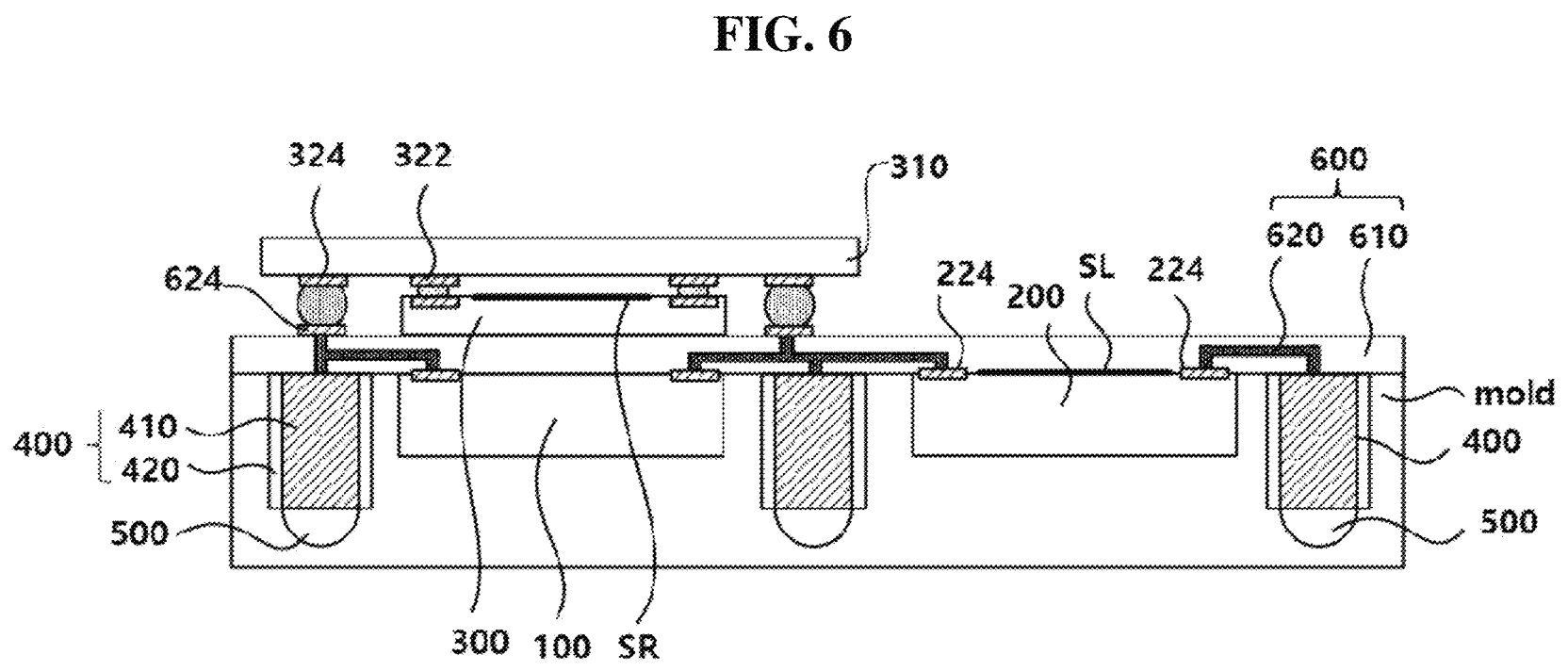

The light-receiving element 300 is arranged on the redistribution layer 600 to be electrically connected to the redistribution layer 600 (S400). FIG. 5 is a cross-sectional view illustrating a state in which the light-receiving element 300 is arranged on the redistribution layer to be electrically connected to the redistribution layer. FIG. 6 is a view illustrating an outline of a state in which a light-receiving element 300 is arranged on a redistribution layer to be electrically connected to the redistribution layer according to another embodiment.

The embodiment shown in FIG. 5 illustrates that the pads 624 and the light-receiving element 300 are electrically connected through wire bonding. The redistribution layer 600 and the light-receiving element 300 may be mechanically connected through an adhesive layer 304 located on a bonding surface of the light-receiving element 300. When the light-receiving element 300 is connected to the redistribution layer 600, the light-emitting surface SL of the light-emitting element 200 and a light-receiving surface SR of the light-receiving element 300 may face the same direction.

According to the embodiment (not shown), the electrical connection between the pads 624 and the light-receiving element 300 may be performed by coupling the external connection terminal such as a conductive bump, a solder ball, or the like formed on a back surface of the light-receiving element and the pads 624.

The embodiment illustrated in FIG. 6 illustrates that the pads 624 are electrically connected to the light-receiving element 300 through a light transmission substrate 310 electrically connected to the light-receiving element 300. In one embodiment, the substrate 310 may be a transparent substrate formed of a material such as glass, polycarbonate (PC), or the like. The substrate 310 may not be entirely transparent, and only a portion through which light passes may be partially transparent or a cavity may be provided to cause the light to pass therethrough.

In the embodiment shown in FIG. 6, the light-receiving element 300 is arranged to receive light through the substrate 310. The substrate 310 has pads 322 and connection members for electrical connection with the light-receiving element 300 and is electrically connected to the light-receiving element 300. The substrate 310 may include pads electrically connected to the pads 624 formed on the redistribution layer 600.

In the embodiment shown in FIG. 6, an example in which all of the electrical connection between the pad 322 formed on the transparent substrate 310 and the light-receiving element, the pad 324 formed on the transparent substrate 310, and the pads 624 formed on the redistribution layer 600 are formed by solder balls is described, but the pads may be formed of one of conductive bumps and pads.

Figure 7:
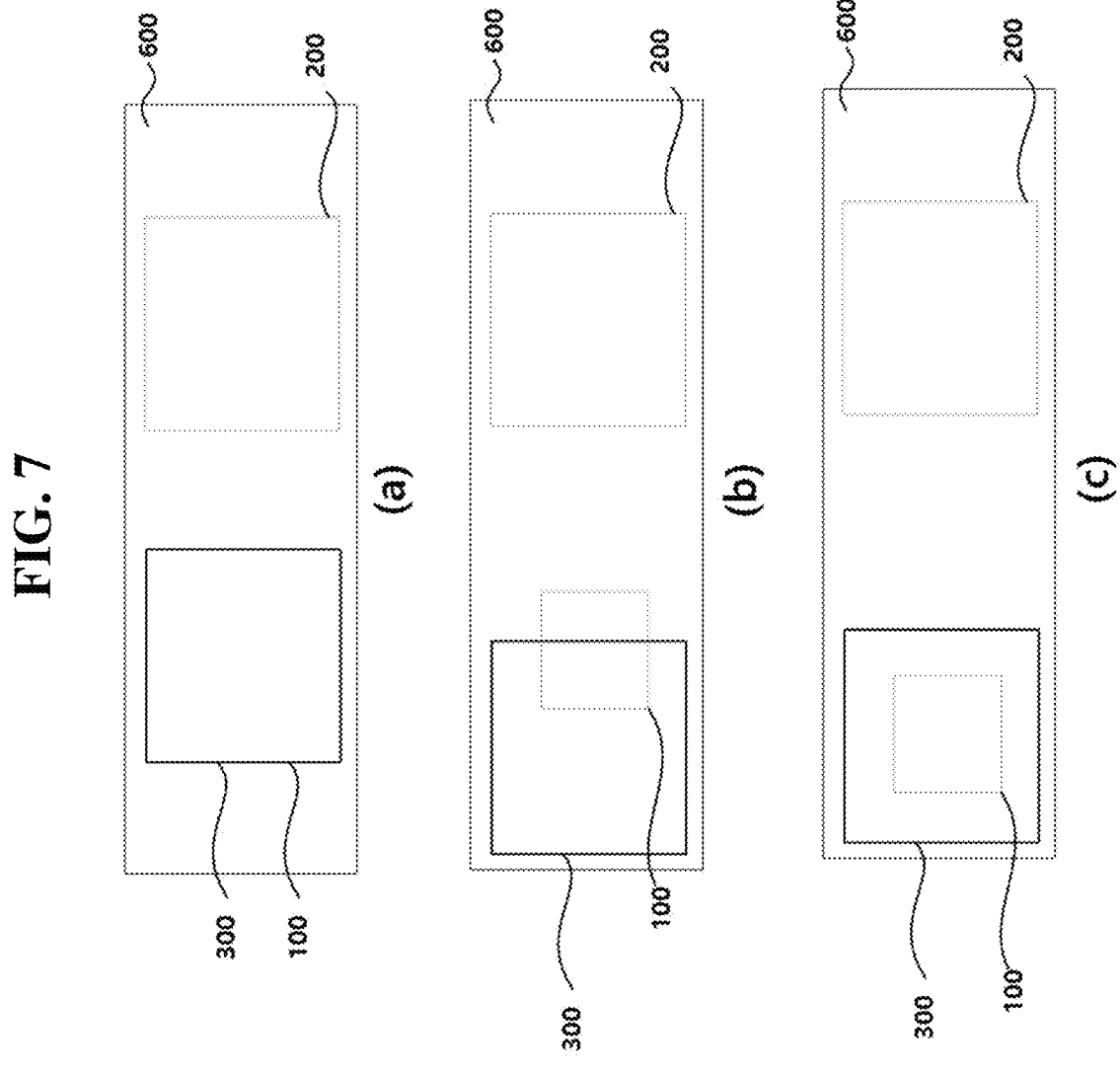
FIG. 7, (a) to (c) are plan views of a package viewed from the top.

FIG. 7, (*a*) to (*c*) are plan views of a package viewed from the top. Referring to FIGS. 5 to 7, the light-receiving element 300 is located above the semiconductor chip 100, and at least a portion of the light-receiving element 300 is arranged to be located on the semiconductor chip 100. As illustrated in FIG. 7, (*a*), the light-receiving element 300 may be located directly above the semiconductor chip 100.

In the embodiment illustrated in FIG. 7, (*b*) and (*c*), the semiconductor chip 100 and the light-receiving element 300 may have different cross-sectional areas. The light-receiving element 300 may be located above the semiconductor chip 100, and at least a portion of the light-receiving element 300 may be located directly above the semiconductor chip 100. Further, as shown in FIG. 7, (*c*), a portion directly above the semiconductor chip 100 may be included within a cross-sectional area of the light-receiving element 300. An area of the manufactured package may be reduced by arranging the light-receiving element 300 in this way.

Figure 14:
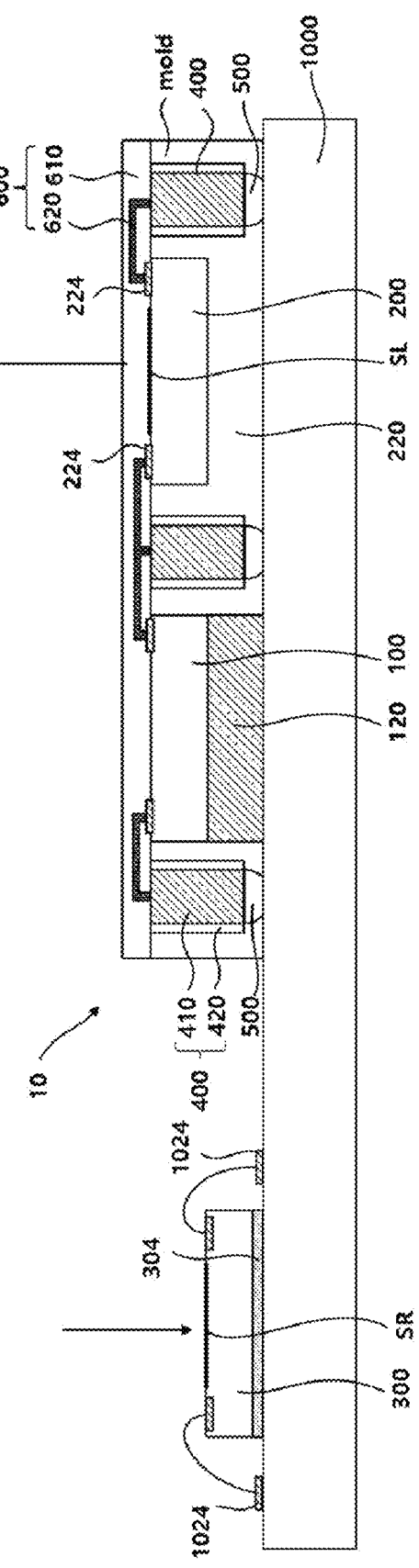
FIG. 14 is a view illustrating another embodiment of the package.

FIGS. 5 to 7 illustrate an embodiment in which the light-receiving element 300 is arranged on the redistribution layer 600. However, as illustrated in FIG. 14, the light-receiving element 300 may be connected to the package through a mother substrate 1000 (see FIG. 14). After the semiconductor chip 100 is molded together with the conductive metal pattern 120 and the light-emitting element 200 is molded together with the conductive metal pattern 220, the conductive metal pattern 120 and the conductive metal pattern 220 may be exposed together with the external connection terminal 500 through a grinding process (see FIG. 8).

Figure 8:
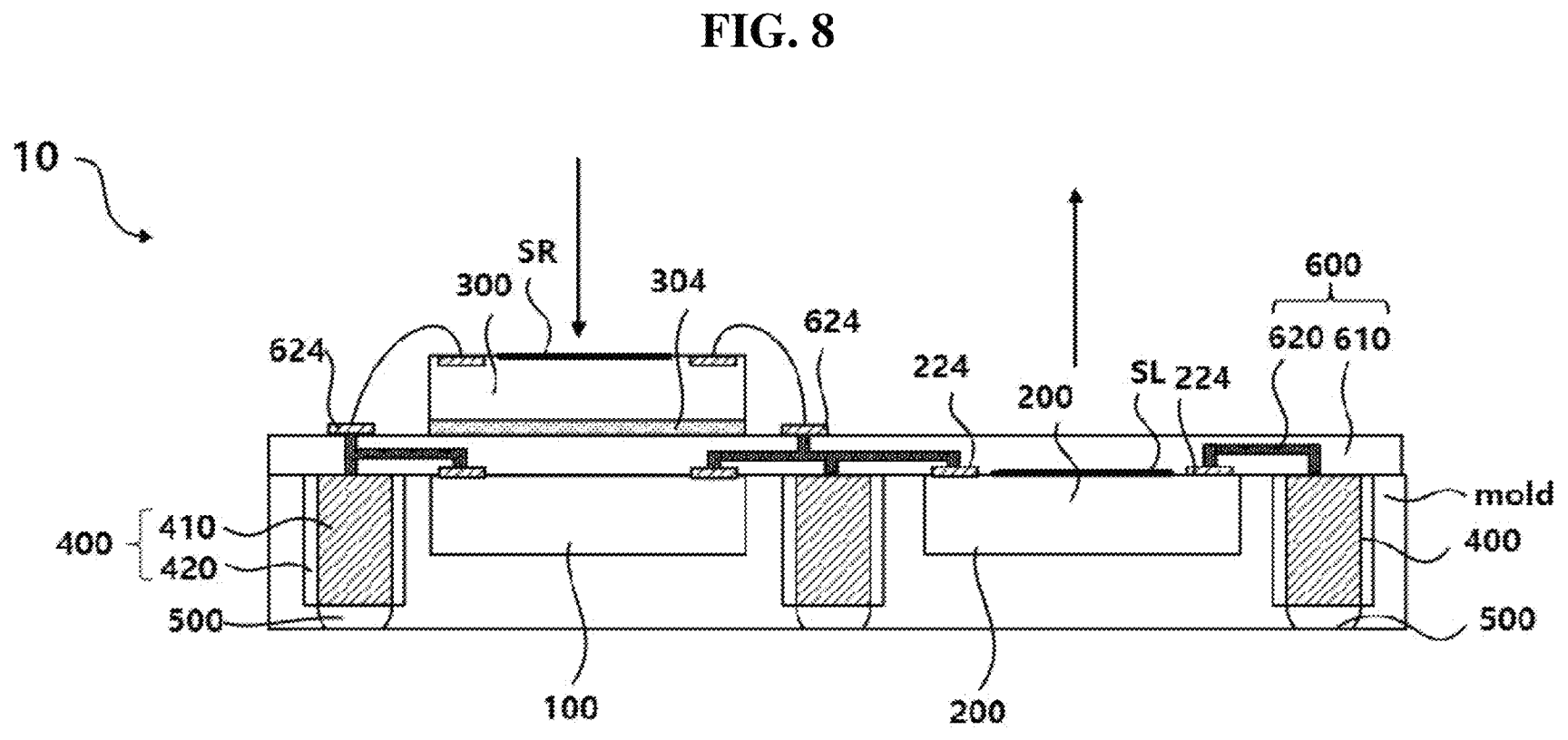

FIG. 8 is a view illustrating a state in which the external connection terminal 500 is exposed. In one embodiment, the external connection terminal 500 is exposed by grinding a back surface of a package 10. For example, the grinding process may be performed by a process such as polishing, chemical-mechanical polishing (CMP), mechanical polishing, or the like. As the external connection terminal 500 is exposed, electrical connection may be performed by connection of the package according to the embodiment and a mother substrate (not shown).

An example in which the process illustrated in FIG. 8 is performed after the light-receiving element 300 is arranged on the redistribution layer 600 is described. However, the grinding process may be performed not only after the light-receiving element 300 is arranged on the redistribution layer 600 but also before the light-receiving element 300 is arranged on the redistribution layer 600.

Figure 9:
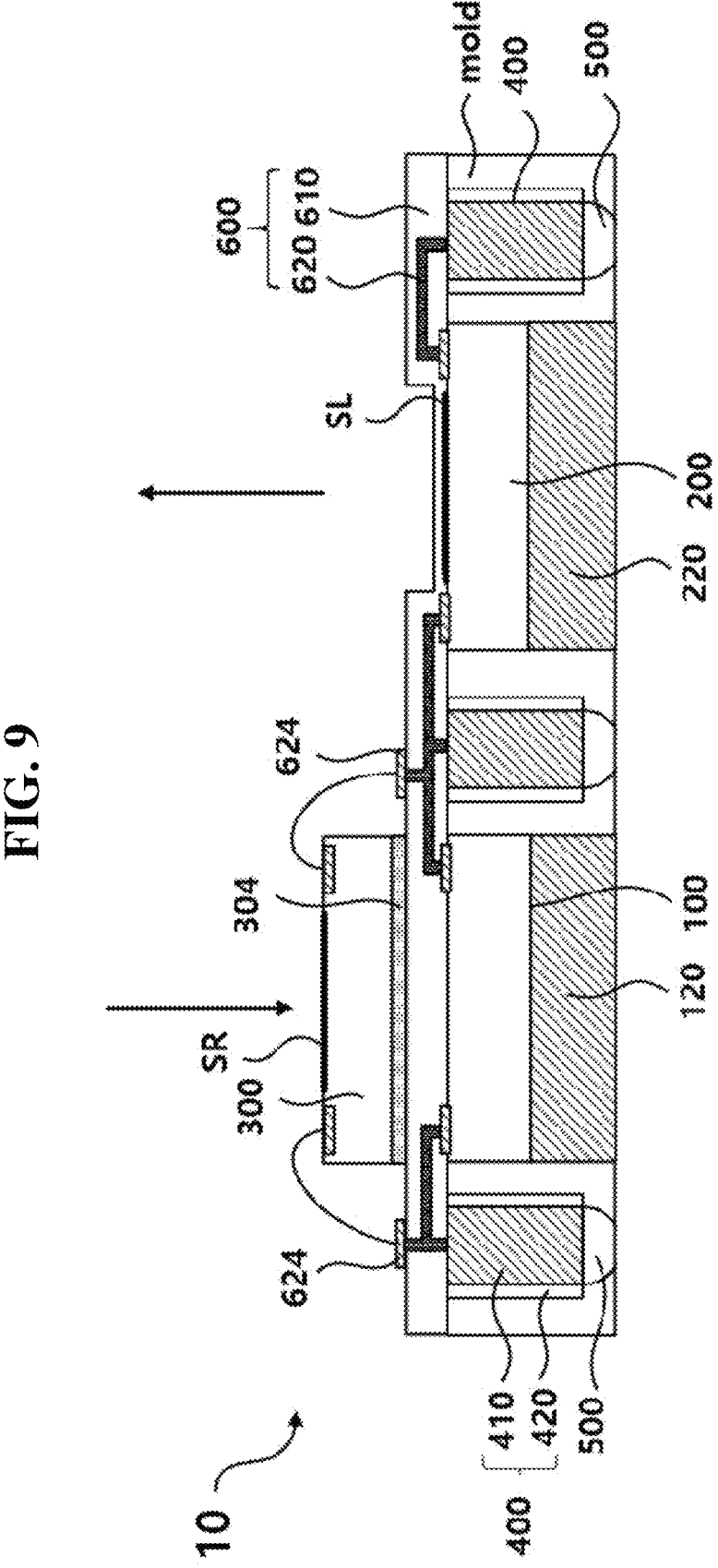
FIG. 9 is a view illustrating a state in which at least a portion of an insulating layer located on an optical path of light provided by the light-emitting element is removed.

Although not shown in the drawings, in the package, a passive element including at least one of a resistor, an inductor, and a capacitor may be further formed on the insulating layer 610. The passive element may be formed on the redistribution layer 600. FIG. 9 is a view illustrating a state in which at least a portion of the insulating layer 610 located on an optical path of light provided by the light-emitting element 200 is removed. FIG. 9 illustrates an example in which the conductive metal pattern 120 is attached to the back surface of the semiconductor chip 100 and the conductive metal pattern 220 is attached to the back surface of the light-emitting element 200, and illustrates an example in which the external connection terminal 500, the conductive metal pattern 120 attached to the back surface of the semiconductor chip, 100 and the conductive metal pattern 220 attached to the back surface of the light-emitting element 200 are exposed during the grinding process.

As the external connection terminal 500, the conductive metal pattern 120 attached to the semiconductor chip 100, and the conductive metal pattern 220 attached to the light-emitting element 200 are exposed, the package according to the embodiment and the mother substrate (not shown) may be connected to form electrical connection. For example, the mother substrate (not shown) may provide a reference voltage VSS to the light-emitting element 200 through the conductive metal pattern 220. Further, the mother substrate may provide driving power to the semiconductor chip 100 through the conductive metal pattern 120 and the external connection terminal 500.

In one embodiment, the insulating layer 610 in the path through which the light provided by the light-emitting element 200 passes is removed. A process of removing the insulating layer 610 may be performed by anisotropic etching, and may be performed using plasma.

An example in which an operation of removing a portion of the insulating layer 610 illustrated in FIG. 9 is performed after arranging the light-receiving element 300 on the redistribution layer 600 is described, but this is only an example, and the operation of removing the portion of the insulating layer 610 may be performed by patterning the insulating layer 610 in the process of forming the wire pattern 620 of the redistribution layer 300.

Although FIG. 9 illustrates an example in which a portion of the insulating layer 610 is removed, according to the embodiment (not shown), after forming a protective film (not shown) on the light-emitting surface SL, an anisotropic etching process using plasma may be performed by completely removing the insulating layer 610 until the protective film is exposed. However, when the insulating layer 610 is formed of a material having a high transmittance of 90% or more for the light provided by the light-emitting element 200, the process of removing the insulating layer 610 may not be performed.

Figure 10:
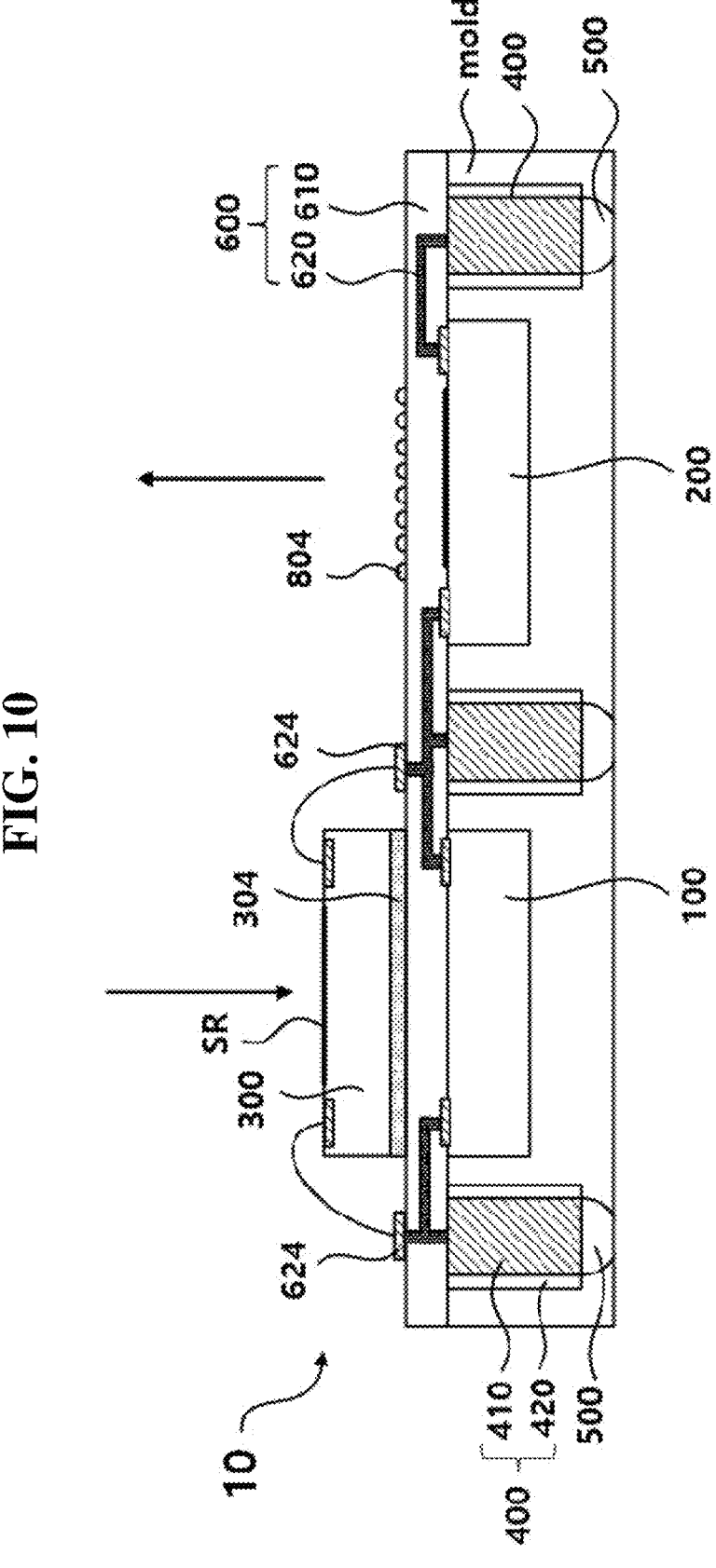
FIG. 10 is a view schematically illustrating a state in which a lens structure is formed on the optical path of the light provided by the light-emitting element.

FIG. 10 is a view schematically illustrating a state in which a lens structure is formed on the optical path of the light provided by the light-emitting element 200. Referring to FIG. 10, a lens structure 804 includes micro lenses 804 respectively corresponding to positions of the light sources 222 (see FIG. 3).

According to another embodiment (not shown), the lens structure 804 may include one or more lenses which perform optical processing for the light provided by the plurality of light sources 222 (see FIG. 3). For example, the lens structure 800 may include a first lens which concentrates the light provided by some light sources 222 (see FIG. 3) and a second lens which collimates the light provided by the remaining light sources 222 (see FIG. 3).

Although an example in which an operation of forming the lens structure 800 is performed after removing the insulating layer 610 is described, this is only an example, and the operation of forming the lens structure 800 may be performed after forming the redistribution layer 600. In another embodiment, the lens structure 800 may be arranged on a transparent substrate such as glass, polycarbonate (PC), or the like. The micro lenses 804 may be formed by a photoresist reflow (PR reflow) method, an inkjet method, a transfer method, and the like.

Figure 11:
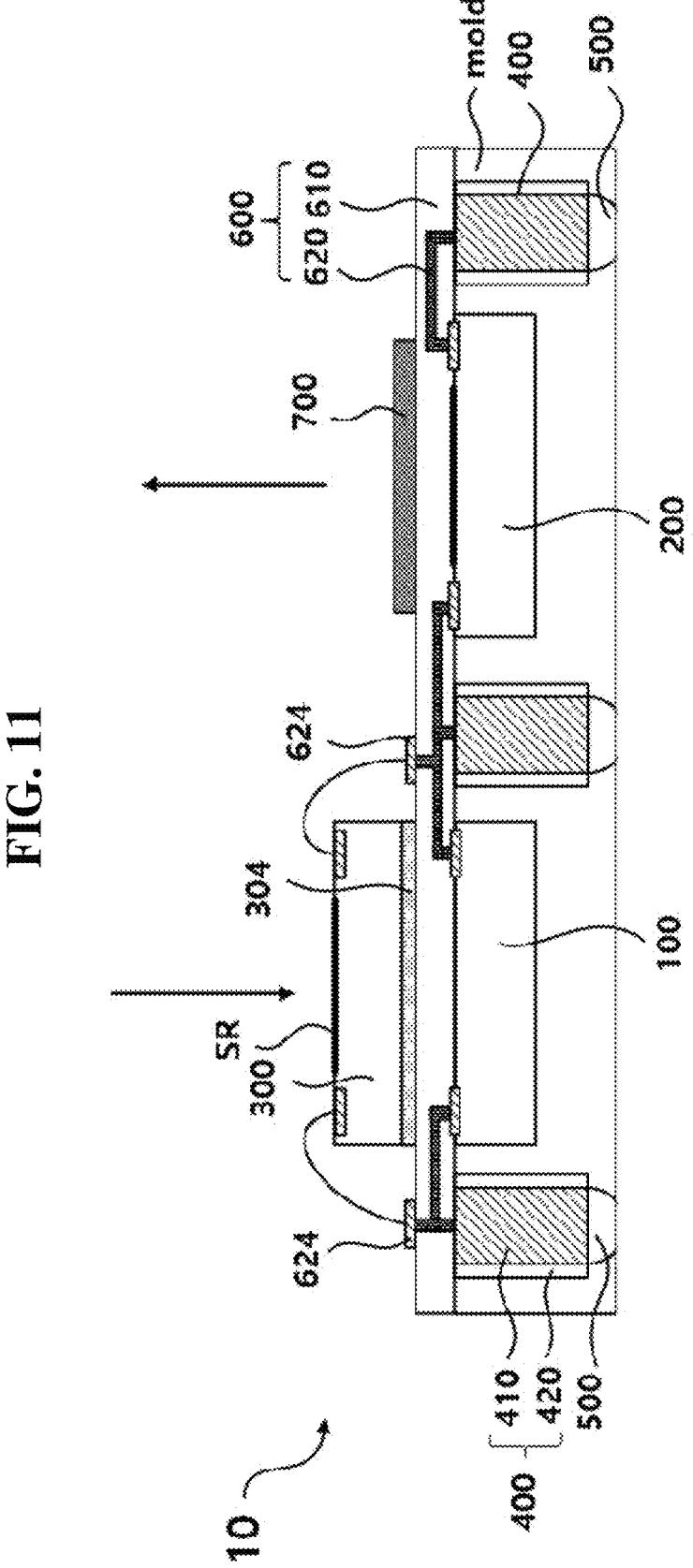
FIG. 11 is a view schematically illustrating a state in which a diffusion member is formed on the light-emitting surface of the light-emitting element.

FIG. 11 is a view schematically illustrating a state in which a diffusion member 700 is formed on the light-emitting surface of the light-emitting element 200. Referring to FIG. 11, the diffusion member 700 may be formed by applying photoresist (PR) on the insulating layer 610, performing patterning to form a random pattern, and then reflowing the random pattern. In the embodiment not shown, the diffusion member 700 may be formed by forming a diffusion pattern on a transparent substrate such as glass, polycarbonate (PC), or the like to diffuse light. The diffusion pattern includes an irregularly formed concave-convex pattern and an irregularly formed straight pattern.

In FIG. 11, an example in which the diffusion member 700 is formed on the insulating layer 610 is described, but this is only an example, and forming the diffusion member 700 may be performed after removing the insulating layer 610, and the diffusion member 700 may be formed after forming the wire pattern 620 when the redistribution layer 600 is formed.

Figure 12:
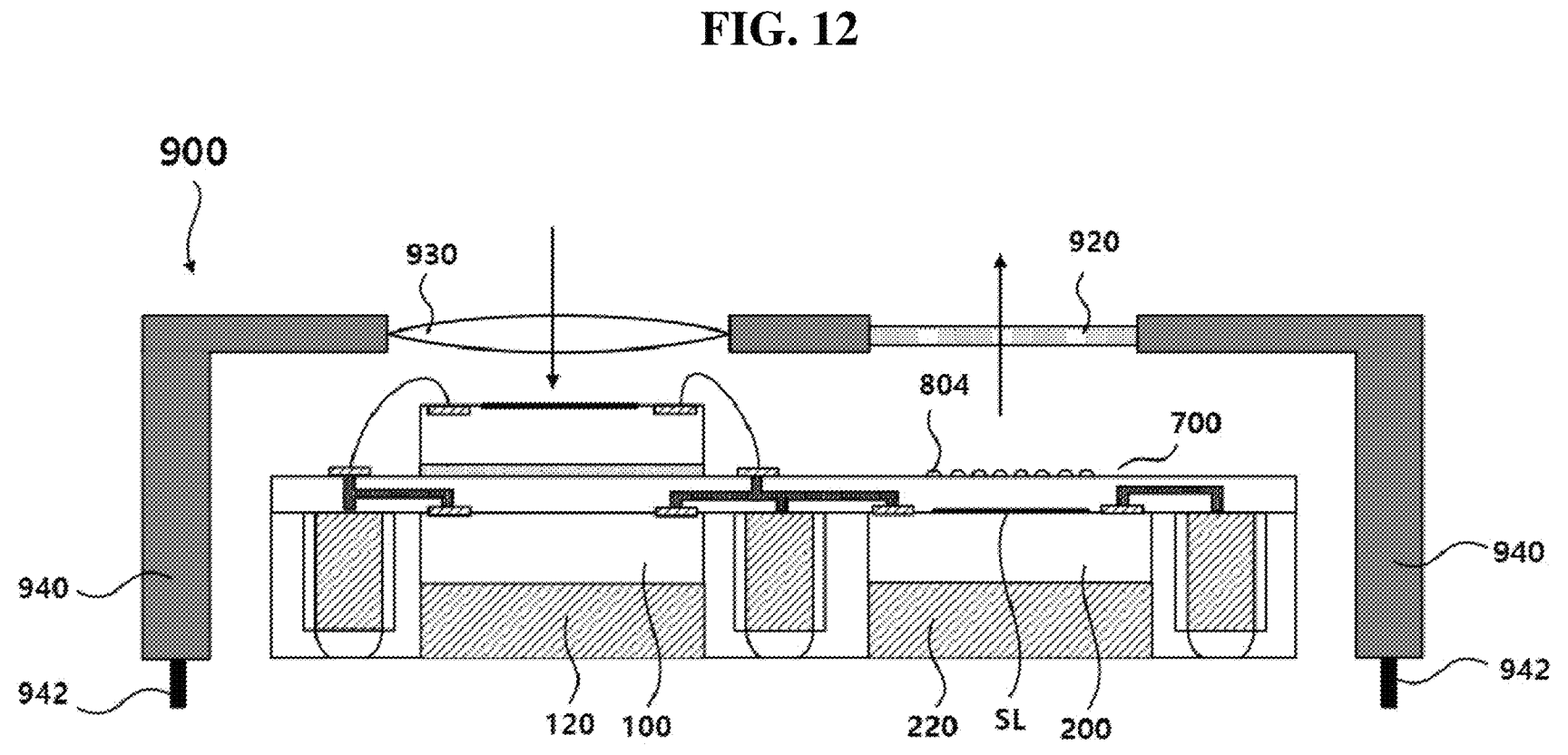
Figure 13:
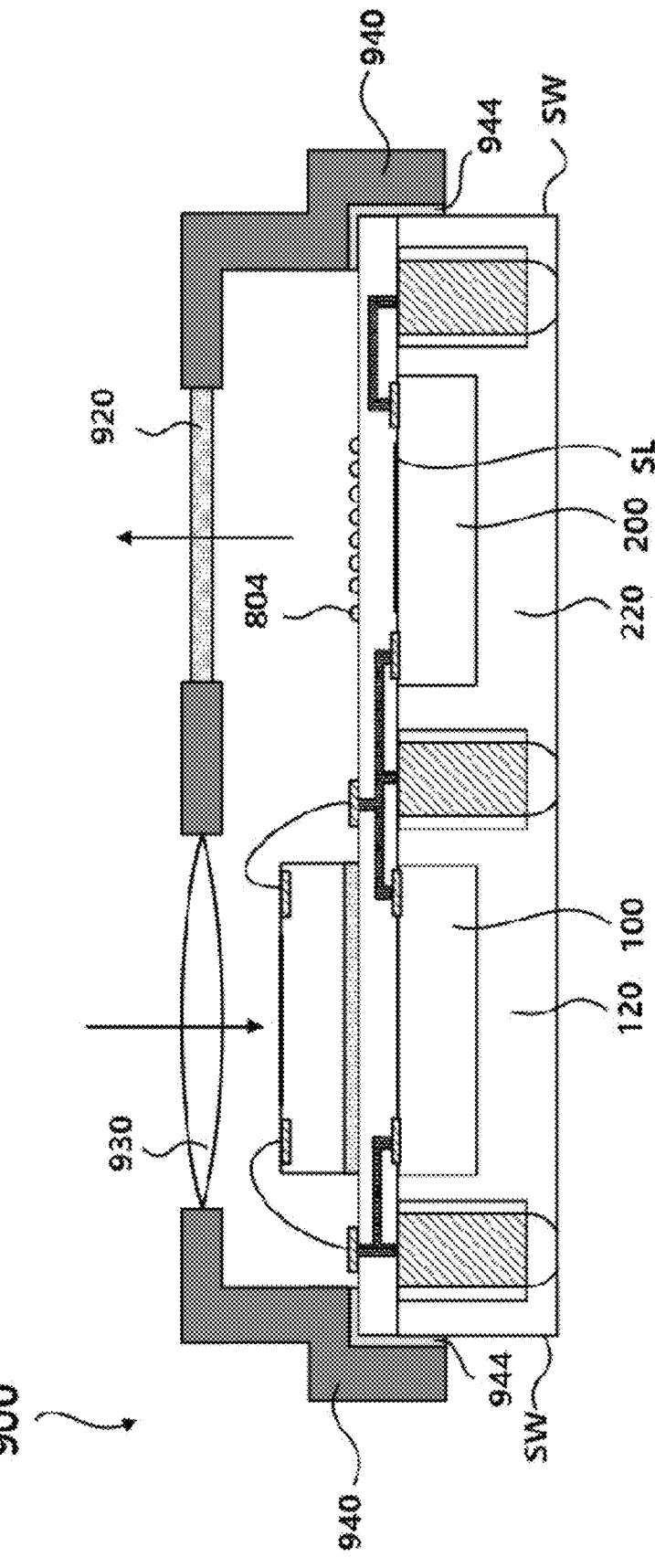

FIGS. 12 and 13 are views illustrating a member holder 900 of the package 10. In the embodiment illustrated in FIG. 12, the member holder 900 supports an optical member 920 located on the optical path of the light-emitting element 200 and an optical member 930 located on the optical path of the light-receiving element 300. The member holder 900 includes legs 940 including pins 942. The pin 942 is inserted into a hole (not shown) formed in the mother substrate 1000 (see FIG. 14) to fix the member holder 900 to the mother substrate (not shown).

Each of the optical members 920 and 930 may be composed of a single lens or a plurality of lenses, a diffuser, a polarization filter, a band pass filter of a desired band (infrared (IR), ultraviolet (UV), visible light, or the like), and a combination thereof. For example, the optical members 920 and 930 may be fixed to an optical member housing (not shown) and coupled to an optical member holder, and the optical member housing may be, for example, a barrel which fixes a lens portion.

In the embodiment illustrated in FIG. 13, the member holder 900 supports the optical member 920 located on the optical path of the light-emitting element 200 and the optical member 930 located on the optical path of the light-receiving element 300. The leg 940 of the member holder 900 is supported by the redistribution layer 600 and a sidewall SW of the package, and an adhesive 944 is arranged on a portion of the leg 940 facing the redistribution layer 600 and the sidewall SW of the package. The adhesive 944 adheres to the sidewall SW of the package and an upper surface of the redistribution layer 600, and fixes the holder 900 to the package.

In the embodiment illustrated in FIGS. 12 and 13, the optical member 930 and the optical member 920 are respectively arranged on the light paths of the light-receiving element 300 and the light-emitting element 200. Accordingly, optical performance of the package may be improved by processing the light provided to the light-receiving element 300 and the light provided by the light-emitting element 200.

In the embodiment illustrated in FIGS. 12 and 13, the optical member 930 is shown as a convex lens. However, this is only an example, and the optical member which performs one or more functions of condensing, dispersing, and collimating light by including at least one of a convex lens, a concave lens, and a combination thereof may be arranged in the member holder 900. Further, the lenses may be formed on the optical path of the light-emitting element 200, and in this case, in the member holder 900, the diffusion member may be arranged on the optical path of the light provided by the light-emitting element 200.

Hereinafter, the package 10 according to the embodiment will be described with reference to FIGS. 8 to 12. However, for concise and clear description, descriptions of elements identical or similar to the above-described element may be omitted. FIGS. 8 to 14 are cross-sectional views illustrating an outline of an optical element semiconductor package 10 according to the embodiment. The optical element semiconductor package 10 according to the embodiment includes a light-emitting element 200, a light-receiving element 300, a semiconductor chip 100 having a semiconductor circuit formed therein, and a mold which encapsulates the semiconductor chip 100 and the light-emitting element 200, a redistribution layer 600 which electrically connects the light-emitting element 200, the light-receiving element 300, and the semiconductor chip 300, a through via 400 electrically connected to the redistribution layer 600 and passing through the mold, and an external connection terminal 500 electrically connected to the through via, and the light-receiving element 300 is located on the redistribution layer 600.

The light-emitting element 200 may be one of a VCSEL and an LED, and may provide light in a wavelength range such as infrared light, visible light, ultraviolet light, or the like. Further, the light-emitting element 200 may output laser light in a desired wavelength range. In one embodiment, the light-receiving element 300 may be an optical element which detects light in a desired wavelength range, and may be one of a photodiode (PD), a complementary metal-oxide semiconductor (CMOS) image sensor (CIS), and a single photon avalanche diode (SPAD). As shown in FIG. 7, (*a*) to (*c*), at least a portion of the light-receiving element 300 may be located directly above the semiconductor chip 100, and accordingly, an advantage that an overall area of the semiconductor package may be reduced is provided.

FIG. 14 is a view illustrating another embodiment of the package 10. Referring to FIG. 14, the package 10 is electrically connected to the mother substrate 1000 through the exposed external connection terminal 500 and the conductive metal patterns 120 and 220. A driving circuit (not shown), a control circuit (not shown), a power circuit (not shown), and the like may be located in the mother substrate 1000. The package 10 may transmit and receive electrical signals, and receive power from the driving circuit (not shown), the control circuit (not shown), and the power circuit (not shown).

The light-receiving element 300 may be located on the mother substrate 1000 and may be electrically connected to the package 10, the driving circuit (not shown), the control circuit (not shown), and the power circuit (not shown) through a conductive path (not shown) formed in the mother substrate 1000.

In one embodiment, the package 10 and the light-receiving element 300 may be electrically connected to the mother substrate through an anisotropic conductive film (ACF) or electrically connected to the mother substrate through surface mounting technology (SMT).

Figure 15:
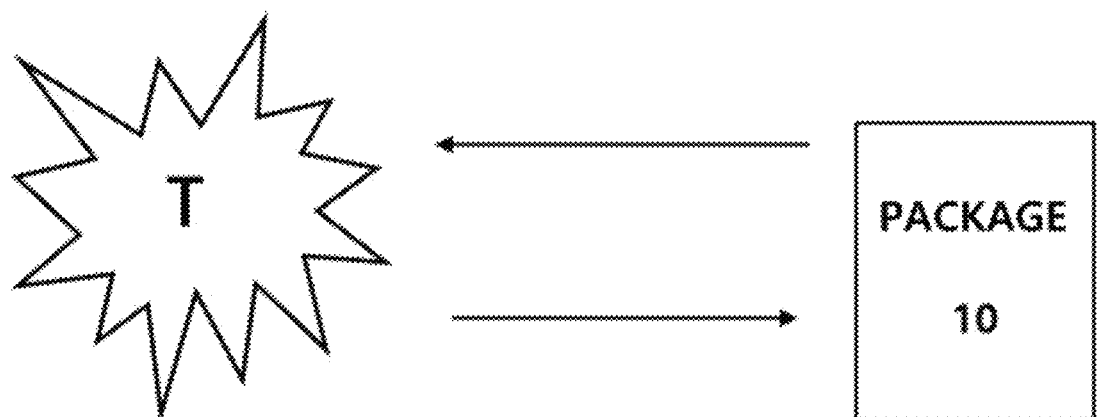
FIG. 15 is a view illustrating one embodiment of the package according to the embodiment.

FIG. 15 is a view illustrating one embodiment of the package 10 according to the embodiment. Referring to FIG. 15, the package 10 may be used to measure a distance to a target T. The light-emitting element 200 receives a driving signal and/or power from the semiconductor chip 100 and provides the light.

The light provided by the light-emitting element 200 proceeds along the optical path. In one embodiment, the package 10 includes the member holder 900, and the member holder 900 includes an optical member arranged on the optical path of the light-emitting element 200 and the optical path of the light-receiving element 300 to perform one or more functions of condensing, dispersing, and collimating the light.

The light is reflected from the target T and provided to the light-receiving element 230 through an optical path L. The semiconductor chip 100 drives the light-emitting element 200 so that the light-emitting element 200 emits the light, and receives an electrical signal corresponding to the reflected light detected by the light-receiving element 300. The semiconductor chip 100 may calculate a time difference (TOF: Time of Flight) from a time at which the light-emitting element 200 emits the light to a time at which the light-receiving element 300 detects the light, and calculate a distance corresponding to the time difference. The calculated distance corresponds to a distance between the optical element semiconductor package 10 and the target T. The calculated time difference or distance may be provided to an external device (not shown) through the external connection terminal 500.

Although the embodiments shown in the drawings are described as a reference for helping understanding of the present invention, they are embodiments for implementation, and merely exemplary, and various modifications and equivalents may be performed by those skill in the art. Accordingly, the true technical scope of the present invention should be defined by the appended claims.

The invention claimed is:

1. A method of manufacturing a package, comprising operations of:

molding a semiconductor chip and a light-emitting element within a mold;

forming a redistribution layer (RDL) configured to electrically connect the semiconductor chip and the light-emitting element; and arranging a light-receiving element on the redistribution layer to electrically connect the light-receiving element and the redistribution layer, wherein the light-receiving element is arranged outside the mold such that at least a portion of the light-receiving element is located directly above the semiconductor chip, wherein the method further comprises:

an operation of attaching a conductive metal pattern to a back surface of the light- emitting element before the molding, wherein the molding is performed by molding the light-emitting element and the conductive metal pattern attached to the light-emitting element together.

2. The method of claim 1, further comprising an operation of attaching a conductive metal pattern to a back surface of the semiconductor chip before the molding, wherein the molding is performed by molding the semiconductor chip and the conductive metal pattern attached to the semiconductor chip together.

3. The method of claim 2, further comprising an operation of exposing the conductive metal pattern attached to the light-emitting element and the conductive metal pattern attached to the semiconductor chip.

4. The method of claim 1, wherein the molding is performed by further molding a conductive rod having an external connection terminal formed thereon together with a conductive metal pattern attached to the semiconductor chip and a conductive metal pattern attached to the light-emitting element.

5. The method of claim 4, further comprising an operation of exposing the external connection terminal.

6. The method of claim 4, wherein the external connection terminal is one of a solder ball, a conductive bump, and a pad.

7. The method of claim 1, wherein the molding includes an operation of further molding a sacrificial member having a lower hardness than the mold, and the method of manufacturing a package further comprises operations of:

perforating the sacrificial member to form a through hole; and forming a conductive material in the through hole.

8. The method of claim 1, wherein the operation of forming the redistribution layer includes operations of:

forming a wire pattern configured to electrically connect the semiconductor chip and the light-emitting element; and forming an insulating layer configured to passivate the wire pattern, the semiconductor chip, and the light-emitting element.

9. The method of claim 8, wherein:

the operation of forming the redistribution layer further includes an operation of forming a pad electrically connected to the wire pattern; and the operation of forming the pad includes operations of removing the insulating layer to expose the wire pattern, performing plating so that the pad electrically connected to the exposed wire pattern is formed, and coating the pad.

10. The method of claim 1, further comprising an operation of forming one of an optical member and a diffuser on an optical path of light provided by the light-emitting element.

11. The method of claim 10, further comprising an operation of removing at least a portion of the redistribution layer located on the optical path before forming one of the optical member and the diffuser.

12. A package comprising:

a light-emitting element;

a light-receiving element;

a semiconductor chip on which a semiconductor circuit is formed;

a mold configured to encapsulate the semiconductor chip and the light-emitting element;

a redistribution layer configured to electrically connect the light-emitting element, the light-receiving element, and the semiconductor chip;

a through via electrically connected to the redistribution layer and passing through the mold; and an external connection terminal electrically connected to the through via, wherein at least a portion of the light-receiving element is located directly above the semiconductor chip, wherein the light-emitting element has a conductive metal pattern attached to a back surface of the light-emitting element, wherein the mold encapsulates the light-emitting element and the conductive metal pattern attached to the light-emitting element together, wherein the through via includes a conductive rod that electrically connects the redistribution layer to the external connection terminal, and a shell that is molded together with the conductive rod and encapsulates the conductive rod, and wherein the light-receiving element is disposed outside the mold.

13. The package of claim 12, wherein:

the light-emitting element is one of a vertical cavity surface emitting laser (VCSEL) and a light-emitting diode (LED); and the light-receiving element is one of a photodiode (PD), a CMOS image sensor (CIS), and a single photon avalanche diode (SPAD).

14. The package of claim 12, wherein the semiconductor circuit includes one or more of a light-emitting element driving circuit, a light-receiving element driving circuit, and a time of flight (TOF) arithmetic circuit.

15. The package of claim 12, wherein the redistribution layer includes an insulating layer configured to passivate the semiconductor package, and a wire pattern configured to electrically connect the light-emitting element, the light-receiving element, and the semiconductor chip.

16. The package of claim 12, wherein an insulating layer is formed as one of a polyimide layer, a polymer layer, and an oxide layer.

17. The package of claim 12, wherein the external connection terminal is one of a solder ball, a conductive bump, and a pad.

18. The package of claim 12, further comprising one of an optical member and a diffusion member formed on an optical path of the light-emitting element.

19. The package of claim 18, wherein:

at least a portion of an insulating layer is removed on the optical path; and one of a light-emitting element lens unit and a diffusion unit is formed on the optical path.

20. The package of claim 18, further comprising:

one of the light-emitting element lens unit and a diffusion unit; and a holder in which a light-receiving element lens unit formed on an optical path of the light-receiving element is located.

21. The package of claim 20, wherein the holder is fixed to the package, a mother substrate on which the package is mounted, or both.

22. The package of claim 12, wherein:

the light-emitting element is stacked and located on the conductive metal pattern; and the light-receiving element is stacked and located on a conductive metal pattern.

23. The package of claim 12, wherein the light-receiving element is located above the semiconductor chip.

\* \* \* \* \*